(12) United States Patent
Kim et al.

(10) Patent No.: US 8,829,541 B2
(45) Date of Patent: Sep. 9, 2014

(54) LIGHT EMITTING DEVICE, LIGHT EMITTING DEVICE PACKAGE, AND LIGHTING SYSTEM

(75) Inventors: MyeongSoo Kim, Seoul (KR); SungKyoon Kim, Seoul (KR); Woo Sik Lim, Seoul (KR); Sung Ho Choo, Seoul (KR); Hee Young Beom, Seoul (KR); Min Gyu Na, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 715 days.

(21) Appl. No.: 13/164,343

(22) Filed: Jun. 20, 2011

(65) Prior Publication Data

US 2011/0309383 A1    Dec. 22, 2011

(30) Foreign Application Priority Data

Jun. 21, 2010    (KR) .................. 10-2010-0058782

(51) Int. Cl.
  *H01L 33/62*    (2010.01)
  *H01L 33/16*    (2010.01)
  *H01L 33/02*    (2010.01)
  *H01L 33/20*    (2010.01)

(52) U.S. Cl.
  CPC .............. *H01L 33/025* (2013.01); *H01L 33/16* (2013.01); *H01L 33/20* (2013.01)
  USPC ......... 257/88; 257/99; 257/103; 257/E33.062

(58) Field of Classification Search
  USPC ................................ 257/88, 99, 103, E33.062
  See application file for complete search history.

(56) References Cited

U.S. PATENT DOCUMENTS

| 8,227,283 B2 * | 7/2012 | Seong et al. ..................... 438/47 |
| 2008/0023710 A1 * | 1/2008 | Park et al. ....................... 257/96 |

* cited by examiner

*Primary Examiner* — Marc Armand
(74) *Attorney, Agent, or Firm* — Birch, Stewart, Kolasch & Birch, LLP

(57) ABSTRACT

Provided are a light emitting device, a light emitting device package, and a lighting system. The light emitting device includes a crystalline substrate having a plurality of side surfaces, a light emitting structure layer comprising a first conductive type semiconductor layer, an active layer, and a second conductive type semiconductor layer on the substrate, and a first electrode on the first conductive type semiconductor layer and a second electrode on the second conductive type semiconductor layer. An amorphous region is defined in a side surface of the substrate, and the amorphous regions of two sides adjacent to each other have different depths from a top surface of the substrate.

20 Claims, 7 Drawing Sheets

LIGHT EMITTING DEVICE, LIGHT EMITTING DEVICE PACKAGE, AND LIGHTING SYSTEM

CROSS-REFERENCE TO RELATED APPLICATIONS

The present application claims priority under 35 U.S.C. 119 and 35 U.S.C. 365 to Korean Patent Application No. 10-2010-0058782 (filed on Jun. 21, 2010), which is hereby incorporated by reference in its entirety.

BACKGROUND

The present disclosure relates to a light emitting device.

Recently, researches on device using light emitting diodes (LEDs) as a device for emitting light have been extensively carried out.

LEDs use the characteristics of a compound semiconductor to convert an electrical signal into a light. LEDs have a structure in which a first conductive type semiconductor layer, an active layer, and a second type conductive semiconductor layer are stacked.

SUMMARY

Embodiments provide a light emitting device having a new structure, a method of manufacturing the light emitting device, a light emitting device package, a lighting system, and a laser scribing method.

Embodiments also provide a light emitting device having improved light extraction efficiency, a method of manufacturing the light emitting device, a light emitting device package, a lighting system, and a laser scribing method.

Embodiments also provide a light emitting device in which cracks are reduced in a substrate, a method of manufacturing the light emitting device, a light emitting device package, a lighting system, and a laser scribing method.

In one embodiment, a light emitting device includes: a crystalline substrate having a plurality of side surfaces; a light emitting structure layer comprising a first conductive type semiconductor layer, an active layer, and a second conductive type semiconductor layer on the substrate; and a first electrode on the first conductive type semiconductor layer and a second electrode on the second conductive type semiconductor layer; wherein the substrate has a plurality of side surfaces, and melting regions having different depths from a top surface of the substrate are defined in two side surfaces at least adjacent to each other of the plurality of side surfaces.

The details of one or more embodiments are set forth in the accompanying drawings and the description below. Other features will be apparent from the description and drawings, and from the claims.

DETAILED DESCRIPTION OF THE EMBODIMENTS

Figure 1:
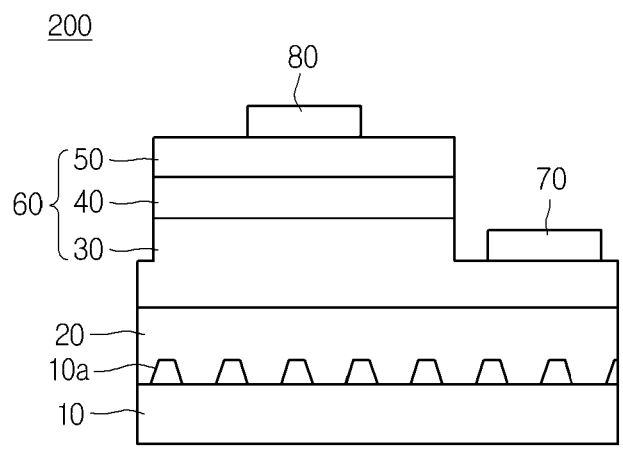
FIGS. 1 to 6 are sectional views illustrating a light emitting device and a process of manufacturing the light emitting device according to an embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device and a method of manufacturing the light emitting device according to embodiments will be described with reference to accompanying drawings.

FIGS. 1 to 6 are sectional views illustrating a light emitting device and a process of manufacturing the light emitting device according to an embodiment. First, a light emitting device according to an embodiment will be described with reference to FIG. 1.

A light emitting device 200 according to an embodiment includes a substrate 10, an undoped semiconductor layer 20 on the substrate 10, and a light emitting structure layer 60 on the undoped semiconductor layer 20. Here, the light emitting structure layer 60 includes a first conductive type semiconductor layer 30 on the undoped semiconductor layer 20, an active layer 40, and a second conductive type semiconductor layer 50. Also, a first electrode 70 is disposed on the first conductive type semiconductor layer 30, and a second electrode 80 is disposed on the second conductive type semiconductor layer 50.

A plurality of projections 10a are disposed on the substrate 10. Each of the projections 10a has a hemisphere shape. For example, the projections 10a may be formed by selectively removing the substrate 10. The projections 10a may scatter light emitted from the active layer 40 to improve light extraction efficiency of the light emitting device 200. The projections 10a may be provided in plurality and various shapes, but is not limited thereto.

For example, the substrate 10 may be formed of at least one of sapphire ($Al_2O_3$), SiC, GaAs, GaN, ZnO, Si, GaP, InP, and Ge, but is not limited thereto. For example, the substrate 10 may serve as a crystalline growth substrate on which the light emitting structure layer 60 is grown. A crystalline sapphire substrate may be used as the substrate 10.

The undoped semiconductor layer 20 may be grown on the substrate 10 in horizontal and vertical directions to cover the projections 10a.

Although a first conductive type impurity is intentionally injected into the undoped semiconductor layer 20, the undoped semiconductor layer 20 may be a nitride layer having conductive properties of a first conductive type. For example, the undoped semiconductor layer 20 may include an undoped GaN layer.

A buffer layer may be disposed between the undoped semiconductor layer 20 and the substrate 10. Also, it is unnecessary to form the undoped semiconductor layer 20. Thus, the undoped semiconductor layer 20 may be omitted.

For example, the first conductive type semiconductor layer 30 may include an N-type semiconductor layer. The first conductive type semiconductor layer 30 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, AlInN, InGaN, AlN, and InN. Here, the first conductive type semiconductor layer 30 may be doped with an N-type dopant such as Si, Ge, or Sn.

The active layer 40 is a layer in which electrons (or holes) injected through the first conductive type semiconductor layer 30 and holes (or electrons) injected through the second conductive type semiconductor layer 50 may meet each other to emit light by a band gap difference of an energy band depending on a formation material of the active layer 40.

The active layer 40 may have one of a single quantum well structure, a multi quantum well (MQW) structure, a quantum dot structure, and a quantum wire structure, but is not limited thereto.

The active layer 40 may be formed of a semiconductor material having a compositional formula of $In_xAl_yGa_{1-x-y}N$ ($0 \leq x \leq 1$, $0 \leq y \leq 1$, $0 \leq x+y \leq 1$). When the active layer 40 has the MQW structure, the active layer 40 may include a plurality of well layers and a plurality of barrier layers, which are stacked on each other. For example, the active layer 40 may be formed at a cycle of an InGaN well layer/GaN barrier layer.

A doped clad layer (not shown) in which an N-type or P-type dopant is doped may be disposed above/under the active layer 40. The clad layer (not shown) may be realized by an AlGaN layer or an InAlGaN layer.

For example, the second conductive type semiconductor layer 50 may be realized by a P-type semiconductor layer. The second conductive type semiconductor layer 50 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlInN, AlN, and InN. Also, the P-type semiconductor layer may be doped with the P-type dopant such as Mg, Zn, Ca, Sr, or Ba.

The first conductive type semiconductor layer 30 may include the P-type semiconductor layer, and the second conductive type semiconductor layer 50 may include the N-type semiconductor layer. Also, a third conductive type semiconductor layer (not shown) including an N-type or P-type semiconductor layer may be disposed on the second conductive type semiconductor layer 50. Thus, the light emitting structure layer 60 may have at least one of an np junction structure, a pn junction structure, an npn junction structure, and a pnp junction structure. Also, impurities may be uniformly or non-uniformly doped into the first and second conductive type semiconductor layers 30 and 50. That is, the light emitting structure 60 layer may have various structures, but is not limited thereto.

The first electrode layer 70 is disposed on the first conductive type semiconductor layer 30, and the second electrode layer 80 is disposed on the second conductive type semiconductor layer 50 to respectively supply a power to the active layer 40.

The light emitting device 200 has amorphous regions at positions different from each other of side surfaces adjacent to the substrate 10. This structure will be described in detail with reference to FIGS. 1 to 10.

A method of manufacturing the light emitting device according to an embodiment will be described with reference to FIGS. 2 to 6.

Figure 2:
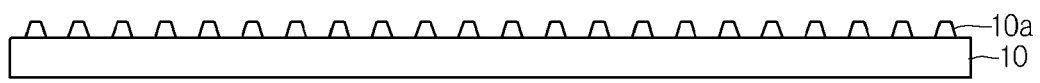

Referring to FIG. 2, a crystalline substrate 10 is prepared. A projection 10a is disposed on the substrate 10. The projection 10a may be formed by selectively removing the substrate 10, but is not limited thereto.

Figure 3:
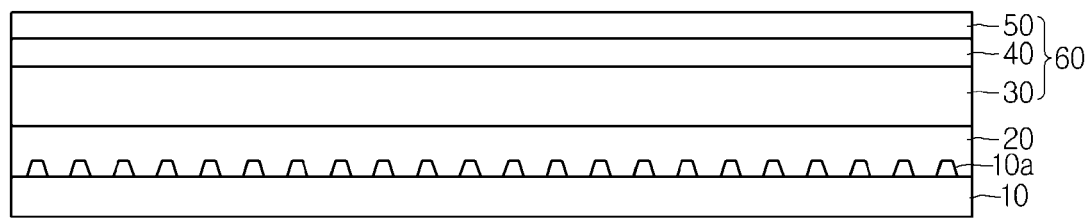

Referring to FIG. 3, an undoped semiconductor layer 20 is disposed on the substrate 10 including the projection 10a. Also, a light emitting structure 60 including a first conductive type semiconductor layer 30, an active layer 40, and a second conductive type semiconductor layer 50 is grown on the undoped semiconductor layer 20.

The undoped semiconductor layer 20 may be grown on the substrate 10 in horizontal and vertical directions to cover the projections 10a.

The first conductive type semiconductor layer 30 may be formed using a GaN-based semiconductor layer containing an N-type impurity such as Si. Also, the second conductive type semiconductor layer 50 may be formed of a GaN-based semiconductor layer containing a P-type impurity such as Mg.

The active layer 40 may have a structure of an InGaN layer/GaN layer having a single quantum well structure or a multi quantum well (MQW) structure which are formed by supplying ammonia (NH3) gas, trimethyl gallium (TMGa) gas, or trimethyl indium (TMIn) gas.

Figure 4:
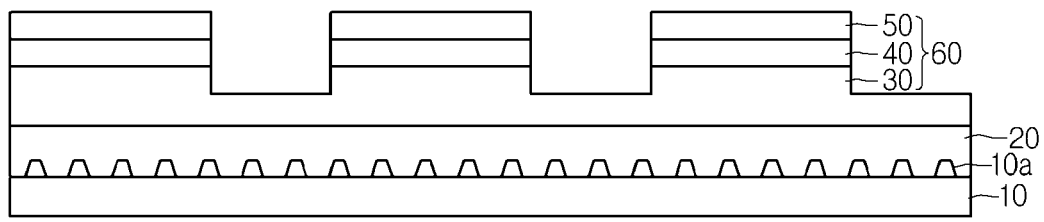
Figure 5:
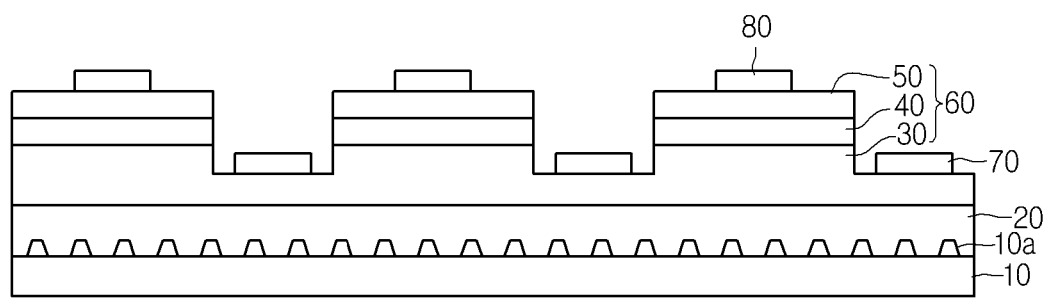

Referring to FIGS. 4 and 5, a mesa etching process for removing portions of the second conductive type semiconductor layer 50, the active layer 40, and the first conductive type semiconductor layer 30 is performed. The mesa etching process is performed to expose a portion of the first conductive type semiconductor layer 30 upward.

Also, a first electrode 70 is formed on the first conductive type semiconductor layer 30, and a second electrode 80 is formed on the second conductive type semiconductor layer 50.

Figure 6:
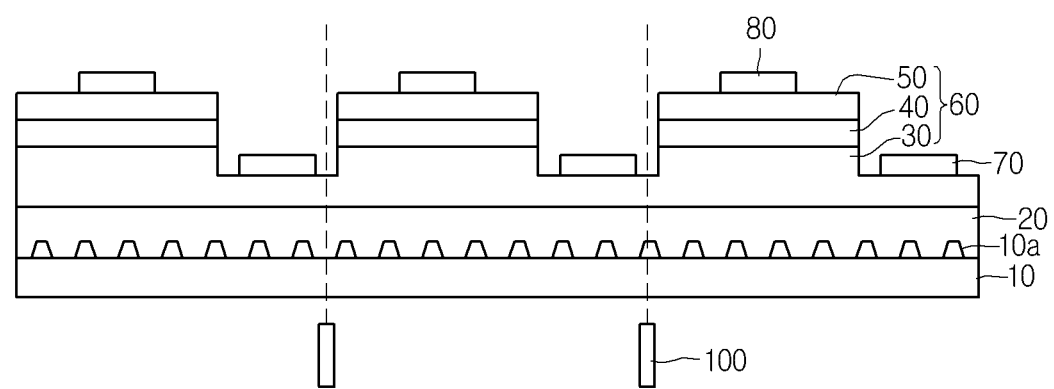

Referring to FIG. 6, a laser scribing process is formed on the substrate 10, the undoped semiconductor layer 20, and the first conductive type semiconductor layer 30 to divide the structure illustrated in FIG. 5 into chip units.

A laser generator 100 may be used for the laser scribing process. The laser generator 100 may allow a laser to be focused into the substrate 10 so that the laser melts the focused portion to convert a crystalline into amorphous, thereby forming an amorphous region. Thus, the substrate 10 may be weakened. As a result, the substrate 10 may be broken by an external impact.

In the current embodiment, a stealth laser process may be performed to form the amorphous region within the substrate 10.

Figure 7:
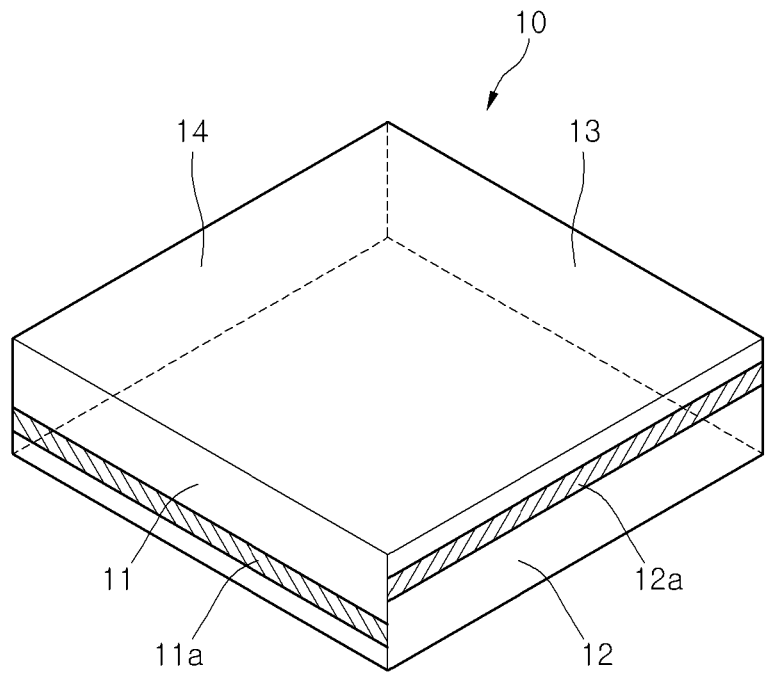
FIGS. 7 to 10 are views illustrating a laser scribing process according to an embodiment.
Figure 8:
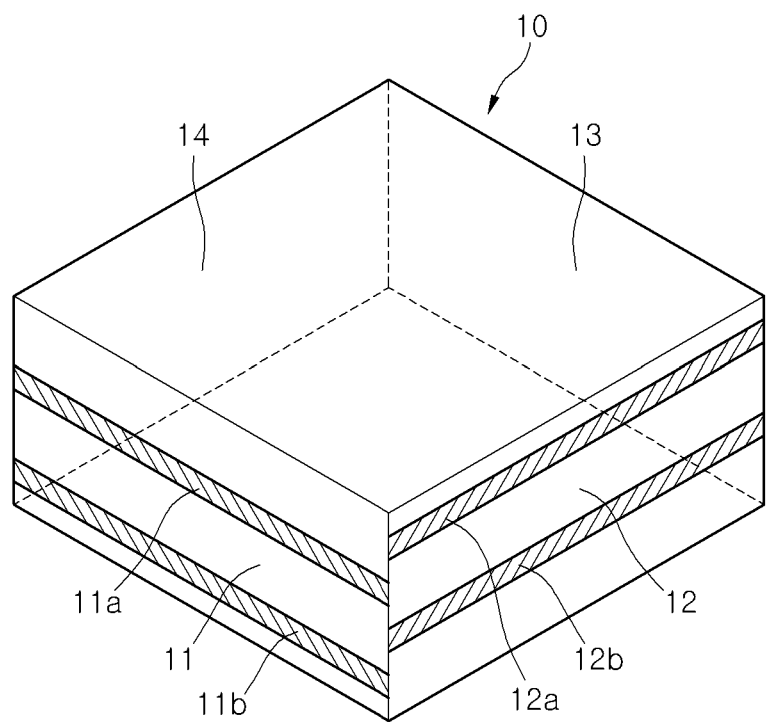

FIGS. 7 to 10 are views illustrating a laser scribing process according to an embodiment. FIGS. 7 to 8 are views illustrating a laser scribing process according to a thickness difference of the substrate.

Referring to FIG. 7, the laser scribing process is performed to divide the substrate 10 into chip units. Each of the substrates 10 divided into the chip units may include a first side surface 11, a second side surface 12, a third side surface 13, and a fourth side surface. Each of the chip units may have an approximately hexahedral shape with a square shape in plane.

When the laser scribing process is performed on the substrate 10, the laser is radiated onto the substrate 10 while the laser generator 100 or the substrate 10 is moved along a square to form the amorphous region having a band shape on an edge of the substrate 10. Here, when the laser is focused at the same depth, since the substrate 10 is largely damaged at an edge portion at which an amorphous region 11a formed on the first side surface 11 and an amorphous region 12a formed on the second side surface 12 are met with each other, a crack may occur at the edge portion at which the two side surfaces of the substrate 10 are met with each other.

Similarly, the laser may be overlappingly radiated onto an edge portion at which the second side surface 12 and the third side surface 13 are met with each other, an edge portion at which the third side surface 13 and the fourth side surface 14 are met with each other, and an edge portion at which the fourth side surface 14 and the first side surface 11 are met with each other. Thus, the above-described portions may be largely damaged by the laser.

Thus, when the laser scribing process is performed onto the substrate 10 in the current embodiment, the amorphous region 11a formed on the first side surface 11 of the substrate 10 and the amorphous region 12a formed on the second side surface of the substrate 10 may not overlap each other or an overlapping region therebetween may be minimized to reduce the damage occurring by radiating the laser. The above-described method may be applied also to the regions overlapping between the second side surface 12 and he third side surface 13, between the third side surface 13 and the fourth side surface 14, and between the fourth side surface 14 and the first side surface 11. That is, the laser scribing process may be performed so that the laser radiated on a top surface of the substrate 10 in a first direction of the substrate 10 and a second direction crossing the first direction is focused at depths different from each other.

Thus, as shown in FIG. 7, the amorphous region 11a formed on the first side surface 11 has a band shape. Also, the amorphous region 11a may have a first depth from the top surface of the substrate 10. The amorphous region 12a adjacent to the first side surface 11 and formed on the second side surface 12 may have a second depth less than the first depth from the top surface of the substrate 10.

The substrate 10 may have a thickness of about 40 μm to about 80 μm, and each of the amorphous regions 11a and 12a may have a width of about 10 μm to about 40 μm.

Referring to FIG. 8, the substrate 10 of FIG. 8 has a thickness greater than that of the substrate 10 of FIG. 7. For example, the substrate 10 of FIG. 8 may have a thickness of about 50 μm to about 120 μm.

When the substrate 10 has a thick thickness, two or more amorphous regions may exist on one side surface of the substrate 10.

For example, the first and second amorphous regions 11a and 11b may be formed on the first side surface 11. Here, the first amorphous region 11a and the second amorphous region 11b may be spaced from each other. Also, the first amorphous region 12a and the second amorphous region 12b may be formed on the second side surface of the substrate 10. Here, the first amorphous region 12a and the second amorphous region 11b may be spaced from each other.

Thus, the amorphous regions 11a and 11b formed on the first side surface 11 of the substrate 10 and the amorphous regions 12a and 12b formed on the second side surface 12 of the substrate 10 may not overlap each other or an overlapping region therebetween may be minimized to reduce the damage occurring by radiating the laser. The above-described method may be applied also to the regions overlapping between the second side surface 12 and he third side surface 13, between the third side surface 13 and the fourth side surface 14, and between the fourth side surface 14 and the first side surface 11.

Figure 9:
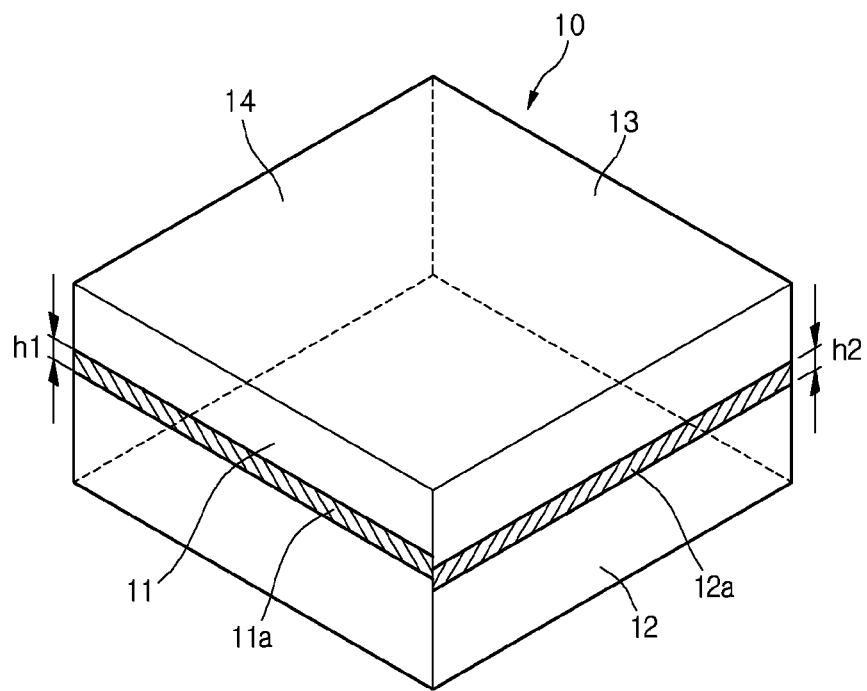
Figure 10:
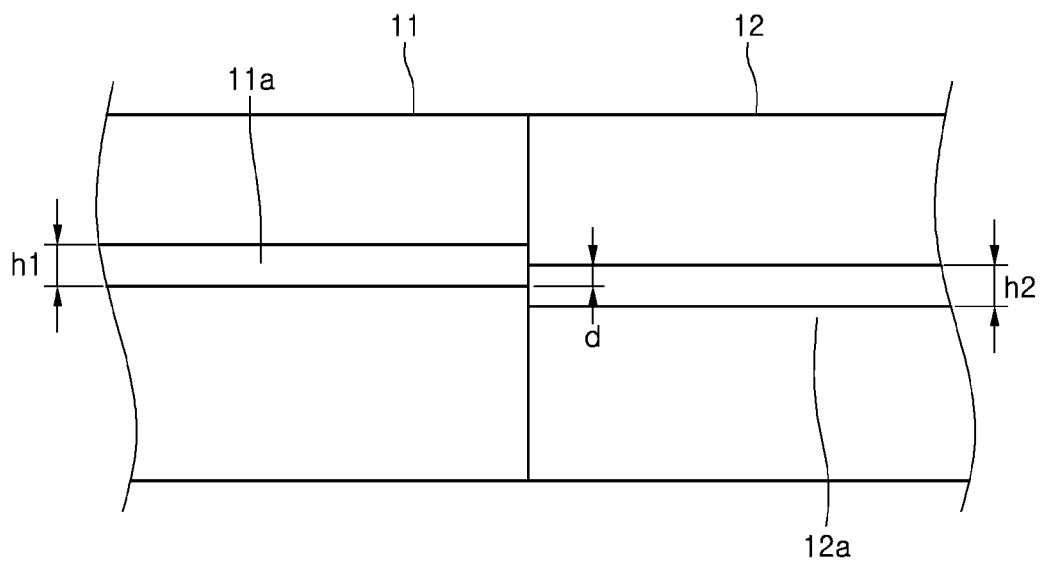

As described in FIGS. 9 and 10, portions of the amorphous regions of the two side surfaces adjacent to each other may overlap each other. The first amorphous region 11a formed on the first side surface 11 of the substrate 10 may have a width h1 of about 10 μm to about 40 μm, and the second amorphous region 12a formed on the second side surface 12 of the substrate 10 may have a width h2 of about 10 μm to about 40 μm.

The laser is focused so that the first and second amorphous regions 11a and 12a partially overlap each other in a horizontal direction.

The region in which the first and second amorphous regions 11a and 12a overlap each other in the horizontal direction may have a width d less than that of the first or second amorphous region 11a or 12a. For example, the region in which the first and second amorphous regions 11a and 12a overlap each other in the horizontal direction may have a width of about 30 μm.

The region in which the two amorphous regions 11a and 12a overlap each other may have a width d less than that of a region in which the two amorphous regions ila and 12a do not overlap each other.

When the laser scribing process is performed according to the above-described method, the damage of the substrate 10 may be reduced to reduce an occurrence of the cracks in the substrate 10 in a breaking process.

As shown in FIGS. 7 to 10, when the laser is radiated into the substrate 10 and then the breaking process is performed to apply the substrate 10 to an external force, the light emitting device 200, in which the occurrence of the cracks in the substrate 10 is reduce, of FIG. 6 may be manufactured.

When the laser scribing method according to the embodiment is applied to manufacture the light emitting device 200, since the laser scribing process is performed without damaging the substrate 10, thicker substrate 10 may be used. When the substrate 10 becomes thicker, i.e., when a thick substrate 10 is used, a region in which light is laterally emitted may be increased to manufacture the light emitting device 200 having high light efficiency.

Figure 11:
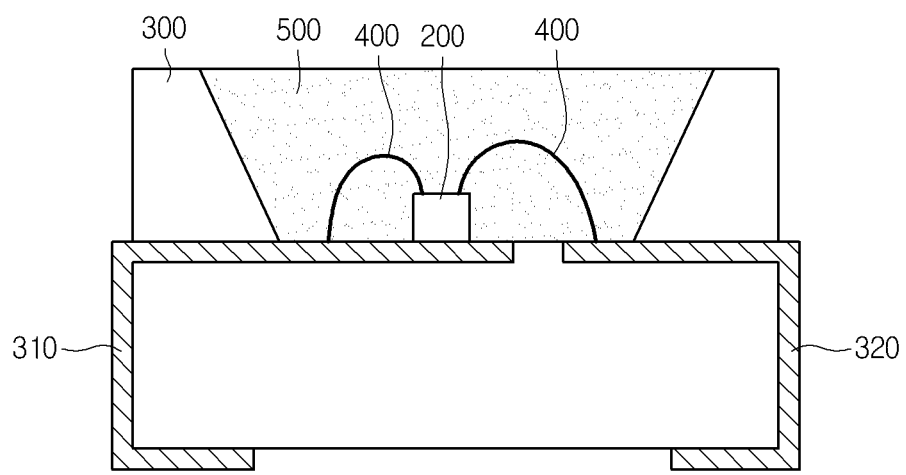
FIG. 11 is a view of a light emitting device package including the light emitting device according to the embodiments.

FIG. 11 is a view of a light emitting device package including the light emitting device according to the embodiments.

Referring to FIG. 11, a light emitting device package 600 according to an embodiment includes a package body 300, first and second conductive layers 310 and 320 disposed on the package body 300, a light emitting device 200 disposed on the package body 300 and electrically connected to the first and second conductive layers 310 and 320, and a molding member 500 surrounding the light emitting device 200.

The package body 300 may be formed of a silicon material, a synthetic region material, or a metal material. Also, an inclined surface may be disposed around the light emitting device 200.

The first and second conductive layers 310 and 320 are electrically separated from each other to supply a power to the light emitting device 200. Also, the first and second conductive layers 310 and 320 may reflect light generated in the light emitting device 200 to increase light efficiency. In addition, the first and second conductive layers 310 and 320 may discharge heat generated in the light emitting device 200 to the outside.

The light emitting device 200 may be applied to the light emitting device of FIG. 6. The light emitting device 200 may be disposed on the package body 300 or disposed on the first or second conductive layer 310 or 320.

The light emitting device 200 may be electrically connected to the first conductive layer 310 and/or the second conductive layer 320 through two wires 400.

The molding member 500 may surround the light emitting device 200 to protect the light emitting device 200. Also, a phosphor may be contained in the molding member 500 to change a wavelength of light emitted from the light emitting device 200.

The light emitting device package 600 according to the embodiment may have superior light efficiency because the light emitting device 200 having the improved light extraction efficiency is applied.

A plurality of light emitting device packages 600 according to an embodiment may be arrayed on a board. Optical members such as a light guide plate, a prism sheet, a diffusion sheet, and a fluorescence sheet may be disposed on a path of the light emitted from the light emitting device packages 600. The light emitting device packages, the board, and the optical members may be functioned as a backlight unit or a lighting unit. For example, a lighting system may include the backlight unit, the lighting unit, an indicating device, a lamp, and a street lamp.

Figure 12:
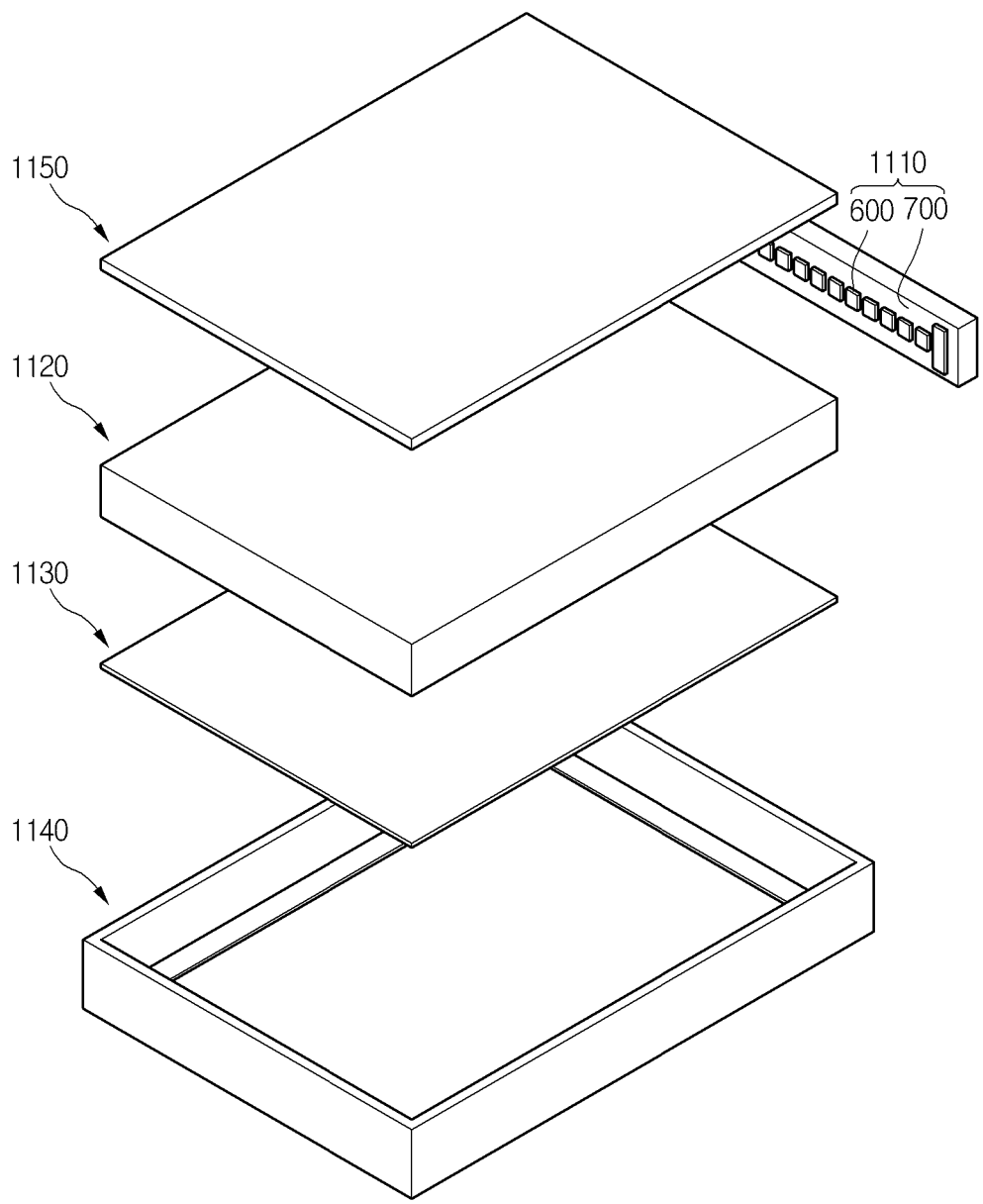
FIG. 12 is a view of a backlight unit using the light emitting device or the light emitting device package according to an embodiment.

FIG. 12 is a view of a backlight unit using a light emitting device or light emitting device package according to an embodiment. However, a backlight unit 1100 of FIG. 12 is described as an example of the lighting system. Thus, the present disclosure is not limited thereto.

Referring to FIG. 12, the backlight unit 1100 may include a bottom frame 1140, a light guide member 1120 disposed within the bottom frame 1140, and a light emitting module 1110 disposed on at least one side or a bottom surface of the light guide member 1120. Also, a reflective sheet 1130 may be disposed under the light guide member 1120.

The bottom frame 1140 may have a box shape with an opened upper side to receive the light guide member 1120, the light emitting module 1110, and the reflective sheet 1130. The bottom frame 1140 may be formed of a metal material or a resin material, but is not limited thereto.

The light emitting module 1110 may include a board 700 and a plurality of light emitting device packages mounted on the board 700. The plurality of light emitting device packages 600 may provide light to the light guide member 1120. Although the light emitting device packages 600 are disposed on the board 700 in the light emitting module 1110 according to the current embodiment, the present disclosure is not limited thereto. For example, the light emitting device 200 may be directly disposed on the board 700.

As shown in FIG. 12, the light emitting module 1110 may be disposed on at least one of inner surfaces of the bottom frame 1140. Thus, the light emitting module 1110 may provide light toward at least one side surface of the light guide member 1120.

However, the light emitting module 1110 may be disposed under the bottom frame 1140 to provide light toward an under surface of the light guide member 1120. Since this structure is variously varied according to a design of the backlight unit 1100, the present disclosure is not limited thereto.

The light guide member 1120 may be disposed within the bottom frame 1140. The light guide member 1120 may receive the light provided from the light emitting module 1110 to produce planar light, thereby guiding the planar light to a display panel (not shown).

For example, the light guide member 1120 may be a light guide panel (LGP). The LGP may be formed of one of a resin-based material such as polymethyl methacrylate (PMMA), a polyethylene terephthalate (PET) resin, a poly carbonate (PC) resin, a cyclic olefin copolymer (COC) resin, and a polyethylene naphthalate (PEN) resin.

An optical sheet 1150 may be disposed above the light guide member 1120.

For example, the optical sheet 1150 may include at least one of a diffusion sheet, a light collection sheet, a brightness enhancement sheet, and a fluorescence sheet. For example, the diffusion sheet, the light collection sheet, the brightness enhancement sheet, and the fluorescence sheet may be stacked to form the optical sheet 1150. In this case, the diffusion sheet 1150 may uniformly diffuse light emitted from the light emitting module 1110, and the diffused light may be collected into the display panel (not shown) by the light collection sheet. Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film. Also, the fluorescence sheet may be a light transmitting plate or film including a phosphor.

The reflective sheet 1130 may be disposed under the light guide member 1120. The reflective sheet 1130 reflects the light emitted through the bottom surface of the light guide member 1120 toward a light emission surface of the light guide member 1120.

The reflective sheet 1130 may be formed of a material having superior reflectance, e.g., a PET resin, a PC resin, or a PVC resin, but is not limited thereto.

Figure 13:
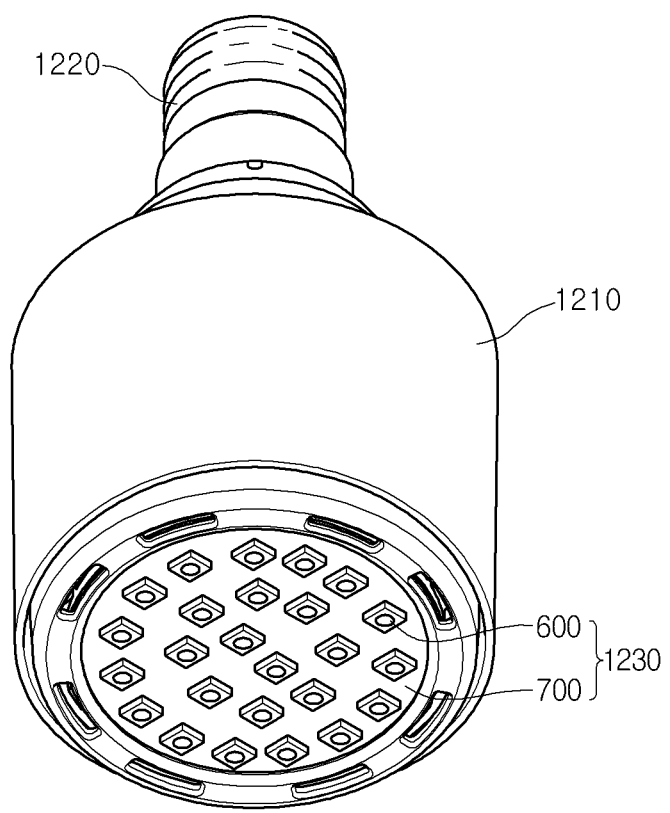
FIG. 13 is a perspective view of a lighting unit using the light emitting device or the light emitting device package according to an embodiment.

FIG. 13 is a perspective view of a lighting unit using a light emitting device or light emitting device package according to an embodiment. However, a lighting unit 1200 of FIG. 13 is described as an example of the lighting system. Thus, the present disclosure is not limited thereto.

Referring to FIG. 13, the lighting unit 1200 may include a case body 1210, a light emitting module 1230 disposed on the case body 1210, a connection terminal 1220 disposed on the case body 1210 to receive a power from an external power source.

The case body 1210 may be formed of a material having good thermal dissipation properties, e.g., a metal material or a resin material.

The light emitting module 1230 may include a board 700 and at least one light emitting device package mounted on the board 700. Although the light emitting device packages 600 are disposed on the board 700 in the light emitting module 1110 according to the current embodiment, the present disclosure is not limited thereto. For example, the light emitting device 200 may be directly disposed on the board 700.

A circuit pattern may be printed on a dielectric to manufacture the board 700. For example, the board 700 may include a printed circuit board (PCB), a metal core PCB, a flexible PCB, and a ceramic PCB.

Also, the board 700 may be formed of a material which may effectively reflect light or have a color by which light is effectively reflected, e.g., a white color or a silver color.

The at least one light emitting device package 600 may be mounted on the board 700. The light emitting device package 600 may include at least one light emitting diode (LED). The LED may include colored LEDs, which respectively emit light having a red color, a green color, a blue color, and a white color and an ultraviolet (UV) LED emitting UV rays.

The light emitting module 1230 may have various combinations of the LED to obtain color impression and brightness. For example, the white LED, the red LED, and the green LED may be combined with each other to secure a high color rendering index. Also, a fluorescence sheet may be further disposed on a path of light emitted from the light emitting module 1230. The fluorescence sheet changes a wavelength of the light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1220 may be electrically connected to the light emitting module 1230 to provide a power to the light emitting module 1230. Referring to FIG. 12, the connected terminal 1220 is screw-coupled to an external power source in a socket manner, but is not limited thereto. For example, the connection terminal 1220 may have a pin shape, and thus, be inserted into the external power source. Alternatively, the connection terminal 1220 may be connected to the external power source by a wire.

As described above, in the lighting system, at least one of the light guide member, the diffusion sheet, the light collection sheet, the brightness enhancement sheet, and the fluorescence sheet may be disposed on the path of the light emitted from the light emitting module to obtain a desired optical effect.

As described above, since the lighting system includes the light emitting device or the light emitting device package according to the embodiment, which has the superior light extraction efficiency, the lighting system may have superior light efficiency.

The embodiments provide the light emitting device having a new structure, the method of manufacturing the light emitting device, the light emitting device package, the lighting system, and the laser scribing method.

The embodiments also provide the light emitting device having improved light extraction efficiency, the method of manufacturing the light emitting device, the light emitting device package, the lighting system, and the laser scribing method.

Embodiments also provide the light emitting device in which cracks are reduced in the substrate, the method of manufacturing the light emitting device, the light emitting device package, the lighting system, and the laser scribing method.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a crystalline substrate having a plurality of side surfaces;
a light emitting structure layer comprising a first conductive type semiconductor layer, an active layer, and a second conductive type semiconductor layer on the substrate; and
a first electrode on the first conductive type semiconductor layer and a second electrode on the second conductive type semiconductor layer;
wherein an amorphous region is defined in a side surface of the substrate, and the amorphous regions of two side surfaces adjacent to each other have different depths from a top surface of the substrate.

2. The light emitting device according to claim 1, wherein the substrate has first and second side surfaces at least adjacent to each other, and a first amorphous region defined in the first side surface is horizontally spaced from a second amorphous region defined in the second side surface.

3. The light emitting device according to claim 1, wherein the substrate has a first side surface, a second side surface, a third side surface, and a fourth side surface, and the amorphous region is defined in each of the first, second, third, and fourth side surfaces,
wherein the amorphous regions defined in at least two side surfaces adjacent to each other of the first, second, third, and fourth side surfaces are horizontally spaced from each other.

4. The light emitting device according to claim 1, wherein the substrate has first and second side surfaces at least adjacent to each other, and a first amorphous region defined in the first side surface partially overlap a second amorphous region defined in the second side surface in a horizontal direction.

5. The light emitting device according to claim 1, wherein the amorphous region has a band shape on the side surface.

6. The light emitting device according to claim 1, wherein the substrate comprises a crystalline sapphire substrate.

7. The light emitting device according to claim 1, wherein the substrate has a pattern on a top surface thereof.

8. The light emitting device according to claim 1, wherein the amorphous region has a depth determined by a focus of a laser for cutting the light emitting device.

9. The light emitting device according to claim 2, wherein the first amorphous region defined in the first side surface is divided into two regions and the two regions are spaced from each other in the first side surface, and the second amorphous region defined in the second side surface is divided into two regions and the two regions are spaced from each other in the second side surface,
wherein the two first amorphous regions defined in the first side surface and the two second amorphous regions defined in the second side surface are horizontally spaced from each other.

10. The light emitting device according to claim 2, wherein each of the first amorphous region defined in the first side surface and the second amorphous region defined in the second side surface has a width of 10 μm to 40 μm.

11. The light emitting device according to claim 4, wherein the region in which the first and second amorphous regions overlap each other has a width less than that of a region in which the first and second amorphous regions do not overlap each other.

12. The light emitting device according to claim 4, wherein the region in which the first and second amorphous regions horizontally overlap each other has a width of 30 μm or less.

13. A light emitting device package comprising:
a body having a recess;
first and second conductive members disposed in the recess, the first and second conductive members being separated from each other,
a light emitting device electrically connected to the first and second conductive members, the light emitting device being disposed in the recess; and
a molding member in which the light emitting device is buried,
wherein the light emitting device comprises: a crystalline substrate having a plurality of side surfaces; a light emitting structure layer comprising a first conductive type semiconductor layer, an active layer, and a second conductive type semiconductor layer on the substrate; and a first electrode on the first conductive type semiconductor layer and a second electrode on the second conductive type semiconductor layer; wherein an amorphous region is defined in a side surface of the substrate, and the amorphous regions of two side surfaces adjacent to each other have different depths from a top surface of the substrate.

14. The light emitting device package according to claim 13, wherein the substrate has first and second side surfaces at least adjacent to each other, and a first amorphous region defined in the first side surface is horizontally spaced from a second amorphous region defined in the second side surface.

15. The light emitting device package according to claim 14, wherein each of the first and second side surfaces has at least two first and second amorphous regions.

16. The light emitting device package according to claim 15, wherein the substrate has first and second side surfaces at least adjacent to each other, and a first amorphous region defined in the first side surface partially overlap a second amorphous region defined in the second side surface in a horizontal direction.

17. The light emitting device package according to claim 16, wherein the region in which the first and second amorphous regions overlap each other has a width less than that of a region in which the first and second amorphous regions do not overlap each other.

18. A lighting device comprising:
a module board; and
a plurality of light emitting device packages disposed on the module board,
wherein the light emitting device package comprises: a body having a recess; first and second conductive members disposed in the recess, the first and second conductive members being separated from each other, a light emitting device electrically connected to the first and second conductive members, the light emitting device being disposed in the recess; and a molding member in which the light emitting device is buried, and
the light emitting device comprises: a crystalline substrate having a plurality of side surfaces; a light emitting structure layer disposed on a top surface of the substrate,
wherein an amorphous region is defined in a side surface of the substrate, and the amorphous regions of two side surfaces adjacent to each other have different depths from a top surface of the substrate.

19. The lighting device according to claim 18, wherein the substrate has first and second side surfaces at least adjacent to each other, and a first amorphous region defined in the first side surface is horizontally spaced from a second amorphous region defined in the second side surface.

20. The lighting device according to claim 18, wherein the substrate has first and second side surfaces at least adjacent to each other, and a first amorphous region defined in the first side surface partially overlap a second amorphous region defined in the second side surface in a horizontal direction.

* * * * *